(12) United States Patent
Sakai (10) Patent No.: US 8,785,227 B2
(45) Date of Patent: Jul. 22, 2014

(54) METHOD OF MANUFACTURING SEMICONDUCTOR LIGHT EMITTING ELEMENT INCLUDING RE-GROWTH LAYER FOR REDUCING WARPAGE

(75) Inventor: Hiromitsu Sakai, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/805,515

(22) PCT Filed: Jun. 23, 2011

(86) PCT No.: PCT/JP2011/064402
§ 371 (c)(1),
(2), (4) Date: Mar. 14, 2013

(87) PCT Pub. No.: WO2011/162332
PCT Pub. Date: Dec. 29, 2011

(65) Prior Publication Data
US 2013/0168691 A1    Jul. 4, 2013

(30) Foreign Application Priority Data

Jun. 25, 2010   (JP) ................................. 2010-145352

(51) Int. Cl.
*H01L 21/00*    (2006.01)
(52) U.S. Cl.
USPC ............................ 438/46; 438/478; 257/103
(58) Field of Classification Search
None
See application file for complete search history.

(56) References Cited

U.S. PATENT DOCUMENTS

| 2003/0045103 | A1  | 3/2003 | Suzuki et al. | |
| 2009/0093077 | A1* | 4/2009 | Nakanishi et al. | 438/46 |
| 2011/0095327 | A1  | 4/2011 | Shinohara et al. | |
| 2011/0163349 | A1* | 7/2011 | Sakai et al. | 257/99 |

FOREIGN PATENT DOCUMENTS

| JP | 2002-212000 A | 7/2002 |
| JP | 2003-63897 A  | 3/2003 |
| JP | 2006-41491 A  | 2/2006 |

(Continued)

OTHER PUBLICATIONS

Office Action ("Notification for the Opinion of Examination") with a mailing date of Jul. 30, 2013 for corresponding Taiwanese Application No. 100121968.
International Search Report for PCT/JP2011/064402 dated Jul. 19, 2011.
Office Action with a mailing date of May 14, 2013 for corresponding Japanese Patent Application No. 2010-145352.

(Continued)

*Primary Examiner* — Andres Munoz
(74) *Attorney, Agent, or Firm* — Sughrue Mion, PLLC (57) ABSTRACT

Provided is a method of manufacturing a semiconductor light emitting element that is capable of making a light emitting wavelength distribution σ of a semiconductor light emitting layer that is obtained small. The method includes a process of laminating a re-growth layer of a compound semiconductor layer on the compound semiconductor substrate which is obtained by forming at least one compound semiconductor layer on a substrate and in which a warping amount H is within a range of 50 μm≤H≤250 μm. The method adopts a method of manufacturing a semiconductor light emitting element including an n-type semiconductor layer, a light emitting layer, and a p-type semiconductor layer that are formed from a compound semiconductor. This method includes: a process of preparing a compound semiconductor substrate which is obtained by forming at least one compound semiconductor layer on a substrate and in which a warping amount H is within a range of 50 μm≤H≤250 μm; and a process of laminating a re-growth layer of the compound semiconductor layer on the compound semiconductor layer of the compound semiconductor substrate in a metalorganic chemical vapor deposition apparatus.

10 Claims, 4 Drawing Sheets

(56) References Cited

FOREIGN PATENT DOCUMENTS

| | | |
|---|---|---|
| JP | 2008-177525 A | 7/2008 |
| TW | 200624710 | 7/2006 |
| TW | 200848557 | 12/2008 |
| TW | 200936827 | 9/2009 |
| WO | 2009/154215 A1 | 12/2009 |
| WO | 2010/032423 A1 | 3/2010 |

OTHER PUBLICATIONS

M. Belousov, et al.; "In situ metrology advances in MOCVD growth of GaN-based materials"; Journal of Crystal Growth; 2004; vol. 272; pp. 94-99.

Tatsuya Ohori, "Present prospects of HEMT on Si technology", Oyo Butsuri, The Japan Society of Applied Physics, Feb. 10, 1995, pp. 119-125, vol. 64, No. 2.

* cited by examiner

METHOD OF MANUFACTURING SEMICONDUCTOR LIGHT EMITTING ELEMENT INCLUDING RE-GROWTH LAYER FOR REDUCING WARPAGE

TECHNICAL FIELD

The present invention relates to a method of manufacturing a semiconductor light emitting element, a semiconductor light emitting element, an electronic device, and a machine device, and more particularly, to a method of manufacturing a semiconductor light emitting element including a Group III compound semiconductor layer, a semiconductor light emitting element, an electronic device, and a machine device.

Priority is claimed on Japanese Patent Application No. 2010-145352, filed Jun. 25, 2010, the content of which is incorporated herein by reference.

BACKGROUND ART

In general, a semiconductor light emitting element including a compound semiconductor layer such as a Group III-V compound semiconductor layer is manufactured by forming a compound semiconductor layer on a substrate formed from a sapphire single crystal or the like, providing a positive electrode, a negative electrode, or the like on the substrate, grinding and polishing a surface to be ground of the substrate, and cutting the substrate into an appropriate shape as a light emitting element chip (refer to PTL 1).

CITATION LIST

Patent Literature

[PTL 1] Japanese Unexamined Patent Application, First Publication No. 2008-177525

SUMMARY OF INVENTION

Technical Problem

However, when a substrate, which is formed from a material different from a compound semiconductor making up the semiconductor layer, is used, and the compound semiconductor layer is formed on the substrate, there is a problem in that a standard deviation σ (in this specification, also referred to as a light emitting wavelength distribution σ (nm)) of a wavelength distribution of a compound semiconductor light emitting layer that is obtained increases. Particularly, in a case of forming the compound semiconductor layer by MOCVD (Metal Organic Chemical Vapour Deposition), this tendency is significant.

This is considered to be because warping occurs in the substrate mainly due to a difference in coefficient of thermal expansion between the substrate and the compound semiconductor. When the warping occurs in the substrate, in a case of forming the compound semiconductor layer by MOCVD, a temperature distribution occurs on the substrate, and thus, for example, a distribution of an element such as In (indium) or the like becomes irregular. Accordingly, when manufacturing a light emitting element formed from the compound semiconductor layer, a light emitting element having an undesired wavelength is produced in the same substrate. As a result, there is a problem in that the product yield of the same substrate deteriorates.

An object of the invention is to provide a method of manufacturing a compound semiconductor light emitting element that is capable of making the light emitting wavelength distribution σ (wavelength distribution standard deviation) of a compound semiconductor light emitting layer that is obtained small. The method includes a process of using a compound semiconductor substrate obtained by forming at least one compound semiconductor layer on a substrate formed from a material different from a constituent material of a compound semiconductor layer to selectively prepare the compound semiconductor substrate in which a warping amount H is within a range of 50 µm≤H≤250 µm, and a process of laminating a re-growth layer of the compound semiconductor layer on the compound semiconductor layer of the compound semiconductor substrate in a metalorganic chemical vapor deposition apparatus.

Solution to Problem

According to the invention, there is a provided a method of manufacturing a semiconductor light emitting element including a Group III compound semiconductor layer. The method includes: a process of preparing a compound semiconductor substrate which is obtained by forming at least one compound semiconductor layer on a substrate and in which a warping amount H is within a range of 50 µm≤H≤250 µm; and a method of sequentially laminating a re-growth layer of the compound semiconductor layer, and an n-type semiconductor layer, a light emitting layer, and a p-type semiconductor layer that have a composition different from the composition of the compound semiconductor layer on the compound semiconductor layer of the compound semiconductor substrate in a metalorganic chemical vapor deposition apparatus.

That is, the invention provides the following inventions.

[1] A method of manufacturing a semiconductor light emitting element including an n-type semiconductor layer, a light emitting layer, and a p-type semiconductor layer that are formed from a compound semiconductor, the method including:

a process of preparing a compound semiconductor substrate which is obtained by forming at least one compound semiconductor layer on a substrate and in which a warping amount H is within a range of 50 µm≤H≤250 µm; and a process of laminating a re-growth layer of the compound semiconductor layer on the compound semiconductor layer of the compound semiconductor substrate in a metal organic chemical vapor deposition apparatus.

[2] The method of manufacturing a semiconductor light emitting element according to [1], wherein the compound semiconductor is a Group III nitride compound semiconductor.

[3] The method of manufacturing a semiconductor light emitting element according to [1] or [2], wherein the re-growth layer is formed to have the film thickness of 0.2 to 5 µm.

[4] The method of manufacturing a semiconductor light emitting element according to any one of [1] to [3], wherein a substrate temperature during the lamination of the re-growth layer is set to 700 to 1,200° C.

[5] The method of manufacturing a semiconductor light emitting element according to any one of [1] to [4], wherein a growth pressure during the lamination of the re-growth layer is set to 15 to 100 kPa.

[6] The method of manufacturing a semiconductor light emitting element according to any one of [1] to [3], further including:

a process of setting a substrate temperature during the lamination of the re-growth layer to a range of 700 to 1,200° C.; and a process of setting a growth pressure during the lamination of the re-growth layer to a range of 15 to 100 kPa, wherein the substrate temperature and the growth pressure are controlled.

[7] The method of manufacturing a semiconductor light emitting element according to any one of [1] to [6], wherein before laminating the re-growth layer, a heat treatment is performed in a metal organic chemical vapor deposition apparatus under conditions of a pressure of 15 to 100 kPa and a substrate temperature of 500 to 1,000° C. and in an atmosphere containing nitrogen and ammonia.

[8] The method of manufacturing a semiconductor light emitting element according to any one of [1] to [7], wherein the compound semiconductor substrate obtained by forming at least one compound semiconductor layer on a substrate is a compound semiconductor substrate obtained by forming at least a buffer layer and an underlying layer on a substrate.

[9] The method of manufacturing a semiconductor light emitting element according to any one of [1] to [7], wherein the compound semiconductor substrate obtained by forming at least one compound semiconductor layer on a substrate is a compound semiconductor substrate obtained by forming at least a buffer layer, an underlying layer, and a first n-type semiconductor layer on a substrate.

[10] The method of manufacturing a semiconductor light emitting element according to any one of [1] to [9], wherein the substrate has a main surface, which includes a flat surface formed from a (0001) C-plane and a plurality of convex portions formed from a surface not parallel with the C-plane, in one surface of the substrate, and the convex portions have a base portion width $d_1$ of 0.05 to 1.5 μm and a height h of 0.05 to 1 μm.

[11] A semiconductor light emitting element that is manufactured by the method of manufacturing a semiconductor light emitting element according to any one of [1] to [10].

[12] An electronic device in which the semiconductor light emitting element according to [11] is embedded.

[13] A machine device in which the electronic device according to [12] is embedded.

Advantageous Effects of Invention

According to the invention, in the method of manufacturing the semiconductor light emitting element, a compound semiconductor substrate, which is obtained by forming at least one compound semiconductor layer on a substrate and in which a warping amount H is within a range of 50 μm≤H≤250 μm, is used, and a re-growth layer of the compound semiconductor layer is laminated on the compound semiconductor substrate. Accordingly, even when a compound semiconductor substrate in which the warping is large is used as a raw material substrate, a light emitting wavelength distribution σ of a semiconductor light emitting layer, which is obtained in the same substrate when forming light emitting layers (an n-type semiconductor layer, a light emitting layer, and a p-type semiconductor layer), may be made to be smaller.

Furthermore, when the re-growth layer is formed to have the film thickness of 0.2 to 5 μm, the light emitting wavelength distribution σ may be made to be relatively smaller. In addition, when the substrate temperature during the lamination of the re-growth layer is set to 700 to 1,200° C., an accepted-product acquisition amount of an LED chip product that is acquired for each substrate wafer may be increased.

In addition, when growth pressure during the lamination of the re-growth layer is set to 15 to 100 kPa, a blue-light wavelength distribution σ of a semiconductor light emitting element I becomes 3.1 nm or less, and an accepted-product acquisition rate of an LED chip product that is acquired for each substrate wafer may be increased.

BRIEF DESCRIPTION OF DRAWINGS

FIGS. 3A-3D illustrate preferred embodiments of the compound semiconductor substrate of the invention.

FIG. 4 shows providing a compound semiconductor substrate with a warp H of 50 μm≤H≤250 μm (Step S10); introducing the compound semiconductor substrate into a MOCVD apparatus (Step S20); laminating a re-growth layer on an uppermost layer of compound semiconductor substrate having same composition as the uppermost layer (Step S30); completing the light emitting element (Step S40); embedding the light emitting element into electronic device (e.g., display) (Step S50); and embedding electronic device into machine device (e.g., vehicle) (Step S60).

DESCRIPTION OF EMBODIMENTS

Hereinafter, an embodiment of the invention will be described in detail. In addition, the invention is not limited to the following embodiment, and various modifications may be made within a gist of the invention. In addition, the attached drawings are only for illustration of the embodiment and do not show actual dimensions.

(Semiconductor Light Emitting Element)

Commonly, a semiconductor light emitting element that is manufactured according to this embodiment includes a predetermined substrate, and a compound semiconductor layer that is formed on the substrate. Examples of a compound semiconductor making up the compound semiconductor layer include Group III-V compound semiconductors, Group II-VI compound semiconductors, Group IV-IV compound semiconductors, and the like. In this embodiment, the Group III-V compound semiconductors are preferable, and among these, a Group III nitride compound semiconductor (also referred to as a Group III nitride semiconductor) is preferable.

Hereinafter, a semiconductor light emitting layer including the Group III nitride compound semiconductor will be described as an example.

Figure 1:
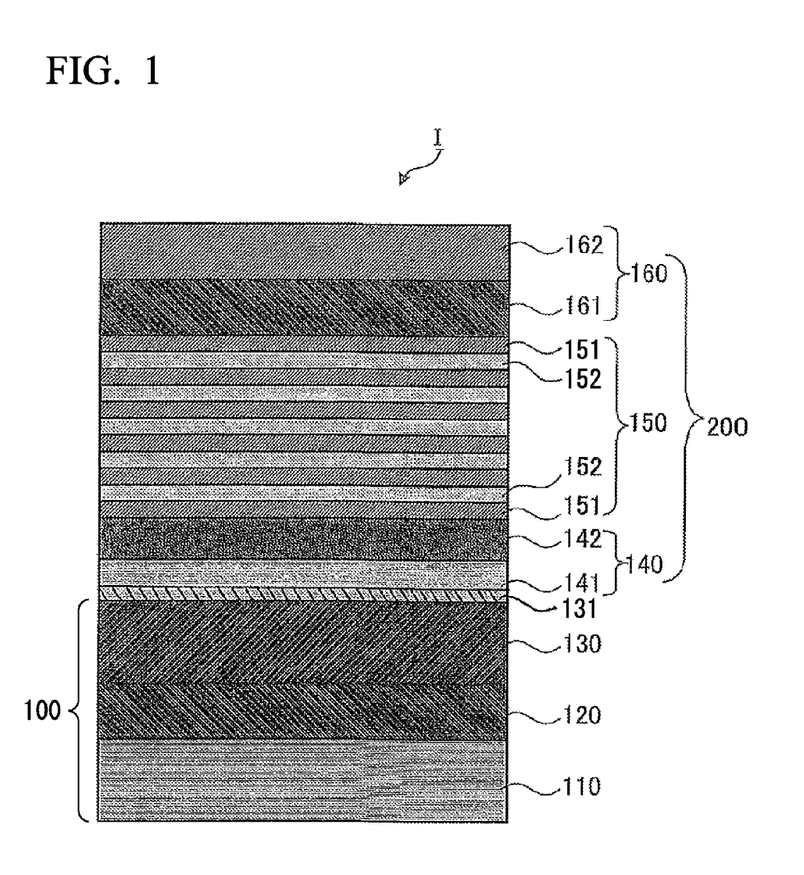
FIG. 1 is a diagram illustrating an example of a layer structure of a semiconductor light emitting element that is manufactured according to the embodiment.

FIG. 1 shows a diagram illustrating an example of a layer structure of a semiconductor light emitting element that is manufactured in this embodiment. As shown in FIG. 1, a semiconductor light emitting element I is configured by sequentially laminating an underlying layer 130, a re-growth layer 131 of the underlying layer 130, an n-type semiconductor layer 140, a light emitting layer 150, and a p-type semiconductor layer 160 on an intermediate layer (buffer layer) 120 that is formed on a substrate 110. In addition, the n-type semiconductor layer 140, the light emitting layer 150, and the p-type semiconductor layer 160 are collectively called a compound semiconductor layer (for example, a Group III nitride compound semiconductor) 200.

Furthermore, a transparent positive electrode 170 (refer to FIG. 2) is laminated on the p-type semiconductor layer 160, and a positive electrode bonding pad 180 is formed on the transparent positive electrode 170. In addition, a negative electrode bonding pad 190 is laminated on an exposed region 143 that is formed in an n-type contact layer 141 of the n-type semiconductor layer 140.

Here, in this embodiment, a compound semiconductor substrate, which includes at least the intermediate layer 120 on the substrate 110 and which is obtained by forming at least one layer of the underlying layer 130 formed from the Group III nitride compound semiconductor on the intermediate layer 120, is treated as a raw material substrate. In addition, in this specification, a compound semiconductor substrate (also referred to as a template substrate in the specification), which includes at least the intermediate layer 120 on the substrate 110 and further includes the underlying layer 130 that is formed from the Group III nitride compound semiconductor and is formed on the intermediate layer 120, and which is obtained by further forming at least one layer of the n-type semiconductor layer 140 on the underlying layer 130, may be treated as the raw material substrate. Here, a compound semiconductor substrate on which at least one layer is formed is called a compound semiconductor substrate 100, and is treated as a semiconductor layer laminated substrate not having a light emitting function.

In addition, in the invention, the re-growth layer of a compound semiconductor layer represents a re-growth layer of the compound semiconductor layer formed on one surface of the raw material substrate.

In addition, in this embodiment, the n-type semiconductor layer 140, which is formed on the re-growth layer 131 of the underlying layer 130 formed from the Group III nitride compound semiconductor, includes an n-type contact layer 141 and an n-type clad layer 142. The light emitting layer 150 has a structure in which a barrier layer 151 and a well layer 152 are alternately laminated. In the p-type semiconductor layer 160, a p-type clad layer 161 and a p-type contact layer 162 are laminated.

In this embodiment, in the template substrate in which the intermediate layer 120 and the underlying layer 130 are formed on the substrate 110 as at least one compound semiconductor layer (Group III nitride compound semiconductor), a total thickness of the compound semiconductor layers is 5 μm or more, and preferably 8 μm or more. In addition, the total thickness is 15 μm or less, and preferably 13 μm or less.

When the total thickness of the above-described compound semiconductor layers (the intermediate layer 120 and the underlying layer 130) is too small, the crystallinity of the light emitting layer 150 and the p-type semiconductor layer 160 that are subsequently laminated becomes poor. Accordingly, when the semiconductor light emitting element I is manufactured, there is a tendency that the light emission intensity becomes weak.

In addition, in this embodiment, the total thickness of the Group III nitride compound semiconductors including the re-growth layer 131 of the underlying layer 130, the n-type semiconductor layer 140, the light emitting layer 150, and the p-type semiconductor layer 160 that are formed on the template substrate is 6 μm or more, and preferably 8 μm or more. In addition the total thickness of these semiconductor layers is 15 μm or less, and preferably 14 μm or less.

(Substrate 110)

The substrate 110 is formed from a material that is different from that of the Group III nitride compound semiconductor, and a Group III nitride semiconductor crystal is epitaxially grown on the substrate 110. Examples of a constituent material of the substrate 110 include sapphire, silicon carbide (SiC), silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodymium-gallium oxide, lanthanum-strontium-aluminum-tantalum oxide, strontium-titanium oxide, titanium oxide, hafnium oxide, tungsten oxide, molybdenum oxide, and the like. Among these, sapphire and silicon carbide (SiC) are preferable.

In addition, it is preferable that in the surface of the substrate 110, surface roughness Ra (arithmetic mean roughness) be different in each of a surface (front surface) on which a semiconductor layer is laminated and a surface (rear surface) that is opposite to the front surface. Particularly, a substrate in which the surface roughness Ra satisfies a relationship of the front surface≤the rear surface may be used.

In addition, it is preferable to use a processed substrate 110. In one surface (front surface), the processed substrate 110 on which the Group III nitride compound semiconductor is formed has a main surface that includes a flat surface formed from a (0001) C-plane and a plurality of convex portions formed from a surface not parallel with the C-plane, and the convex portions have a base portion width $d_1$ of 0.05 to 1.5 μm and a height h of 0.05 to 1 μm. As this processed substrate, for example, a processed substrate 110, which is formed in accordance with a method described in WO/2009/154215, may be used. That is, in a shape of the convex portion of the processed substrate 110 that may be preferably used in the invention, the base portion width $d_1$ is set to be 0.05 to 1.5 μm, the height h is set to be ¼ times or more the base portion width $d_1$ within a range of 0.05 to 1 μm, and a distance $d_2$ between adjacent convex portions 12 is set to be 0.5 to 5 times the base portion width $d_1$. Here, the base portion width $d_1$ of the convex portion 12 represents a length of the maximum width in the base (base portion 12a) of the convex portion 12. In addition, the distance $d_2$ between the adjacent convex portions 12 represents the distance between edges of base portions 12a of the closest convex portions 12.

As an example, curved bowl-shaped (semi-spherical) convex portions may be provided on one surface of a sapphire substrate.

(Intermediate Layer 120)

As described above, in this embodiment, the substrate 110 is formed from a material that is different from that of the Group III nitride compound semiconductor. Accordingly, as described later, when the compound semiconductor layer 200 is formed by metal organic chemical vapor deposition (MOCVD), it is preferable that the intermediate layer 120 exhibiting a buffer function be provided on the substrate 110. Particularly, it is preferable that the intermediate layer 120 have a single crystal structure from a viewpoint of the buffer function. In a case where the intermediate layer 120 having the single crystal structure is formed on the substrate 110, the buffer function of the intermediate layer 120 effectively operates, and thus the underlying layer 130 that is formed on the intermediate layer 120 and the compound semiconductor layer 200 become crystalline films having satisfactory orientation and crystallinity.

It is preferable that the intermediate layer 120 contain Al, and more preferably AlN that is a Group III nitride. A constituent material of the intermediate layer 120 is not particularly limited as long the constituent material is a Group III nitride compound semiconductor expressed by a general formula AlGaInN. Furthermore, As or P of Group V may be contained. In a case where the intermediate layer 120 has a composition containing Al, GaAlN is preferable, and a composition of Al is preferably 50% or more.

(Underlying Layer 130)

As a material that is used for the underlying layer 130, a Group III nitride compound semiconductor containing Ga (GaN-based compound semiconductor) is used, and particularly, either AlGaN or GaN may be appropriately used. The film thickness of the underlying layer 130 is 0.1 μm or more, more preferably 0.5 μm or more, and still more preferably 1 μm or more.

(Re-Growth Layer 131)

It is preferable that the re-growth layer 131 of the underlying layer 130 be formed on the underlying layer 130. When the re-growth layer 131 is formed on the underlying layer 130, warping of the compound semiconductor substrate may be controlled by subsequently resuming the growth of the underlying layer 130 in a growth chamber of the metal organic chemical vapor deposition apparatus. In addition, in a case where the re-growth layer 131 is formed, surface flatness of the underlying layer 130 (the re-growth layer 131) may be improved. Accordingly, the n-type contact layer 141 having high crystallinity may be formed on the re-growth layer 131, and thus an effect of improving the output of a semiconductor light emitting element becomes relatively significant.

In addition, it is preferable that the underlying layer 130 and the re-growth layer 131 be formed from the same material. It is preferable that the film thickness of the re-growth layer 131 be within a range of 0.2 to 5 μm. In a case where the re-growth layer 131 is formed to have the film thickness within this range, the warping of the compound semiconductor substrate may be controlled by subsequently resuming the growth of the underlying layer 130 in the growth chamber of the metal organic chemical vapor deposition apparatus.

In a case where the film thickness of the re-growth layer 131 is less than 0.2 μm, the surface flatness of the re-growth layer 131 is not high, and thus this case is not preferable. In addition, in a case where the film thickness of the re-growth layer 131 exceeds 5 μm, an amount of impurities or deposits that remain after forming the re-growth layer 131 in the growth chamber of the metal organic chemical vapor deposition apparatus becomes large. Therefore, defectiveness of the n-type semiconductor layer 140, the light emitting layer 150, and the p-type semiconductor layer 160 may easily occur due to the impurities or deposits. In addition, a treatment time that is taken to form the re-growth layer 131 becomes long, and thus productivity of the semiconductor light emitting element deteriorates. Therefore, this is not preferable.

On the other hand, in the invention, the re-growth layer 131 may be formed on the n-type contact layer 141 to be described later as a re-growth layer 131 formed from the same material as that of the n-type contact layer 141. In a case where the re-growth layer 131 formed from the same material as the n-type contact layer 141 is formed on the n-type contact layer 141, the warping of the compound semiconductor substrate may be controlled by subsequently resuming the growth of the n-type contact layer 141 in the growth chamber of the metal organic chemical vapor deposition apparatus. In addition, in a case where the re-growth layer 131 is formed, surface flatness of the n-type contact layer 141 (the re-growth layer 131) may be improved. Accordingly, the n-type clad layer 142 having high crystallinity may be formed on the re-growth layer 131, and thus an effect of improving the output of a semiconductor light emitting element becomes relatively significant.

It is preferable that the n-type contact layer 141 and the re-growth layer 131 be formed from the same material.

In addition, it is preferable that the film thickness of the re-growth layer 131 be within a range of 0.2 to 5 μm.

In a case where the re-growth layer 131 is formed to have the film thickness within this range, the warping of the compound semiconductor substrate may be controlled by subsequently resuming the growth of the n-type contact layer 141 in the growth chamber of the metal organic chemical vapor deposition apparatus.

On the other hand, in a case where the film thickness of the n-type contact layer 141 is less than 0.2 μm, surface flatness of the re-growth layer 131 is not high, and this case is not preferable. In addition, in a case where the film thickness of the re-growth layer 131 exceeds 5 μm, an amount of impurities or deposits that remain after forming the re-growth layer 131 in the growth chamber of the metalorganic chemical vapor deposition apparatus becomes large. Therefore, defectiveness of the n-type semiconductor layer 140, the light emitting layer 150, and the p-type semiconductor layer 160 may easily occur due to the impurities or deposits. In addition, a treatment time that is taken to form the re-growth layer 131 becomes long, and thus productivity of the semiconductor light emitting element deteriorates. Therefore, this is not preferable.

(n-Type Semiconductor Layer 140)

The n-type semiconductor layer 140 includes the n-type contact layer 141 (also referred to as a first n-type semiconductor layer 141) and the n-type clad layer 142 (also referred to as a second n-type semiconductor layer 142). Similarly to the underlying layer 130, as the n-type contact layer 141, a GaN-based compound semiconductor is preferably used. In addition, it is preferable that a gallium nitride-based compound semiconductor, which makes up the underlying layer 130 and the n-type contact layer 141, have the same composition in each case. The total film thickness of these layers is 6 μm or more, more preferably 8 μm or more, and still more preferably 9 μm or more. In addition, the total thickness of theses semiconductor layers is 15 μm or less, and more preferably 14 μm or less.

(n-Type Contact Layer 141)

Figure 2:
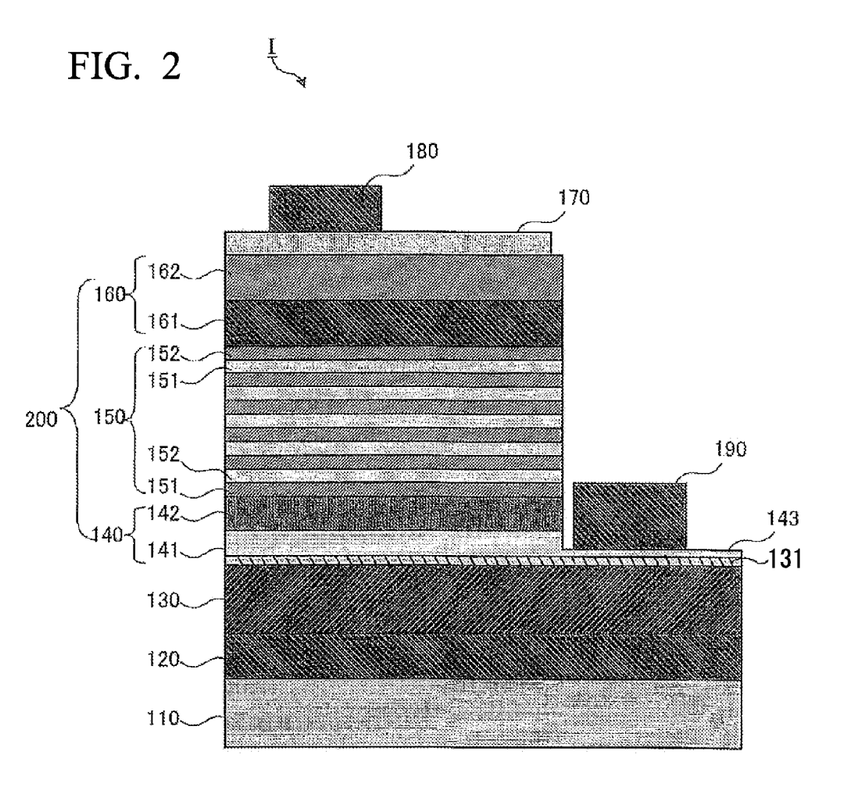
FIG. 2 is a diagram illustrating an example of the semiconductor light emitting element that is obtained by a manufacturing method to which the embodiment is applied.
Figure 3A:
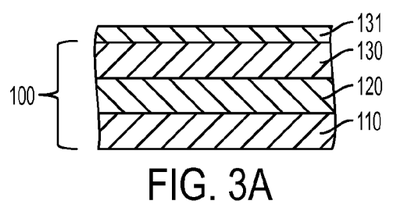
FIG. 3A shows compound semiconductor substrate 100, obtained by forming a buffer layer 120 and an underlying layer 130 on substrate 110, and re-growth layer 131 is formed on compound semiconductor substrate 100.
Figure 3B:
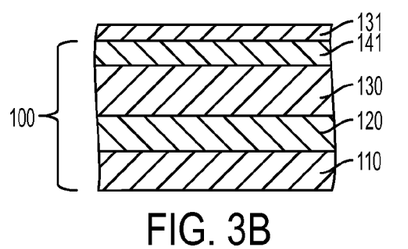
FIG. 3B shows compound semiconductor substrate 100, obtained by forming buffer layer 120, underlying layer 130 and a first n-type semiconductor layer 141 on substrate 110, and re-growth layer 131 is formed on compound semiconductor substrate 100.
Figure 3C:
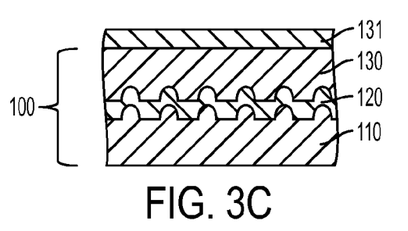
FIG. 3C shows the compound semiconductor substrate of FIG. 3A, where substrate 110 has a plurality of convex portions formed on an upper surface thereof.
Figure 3D:
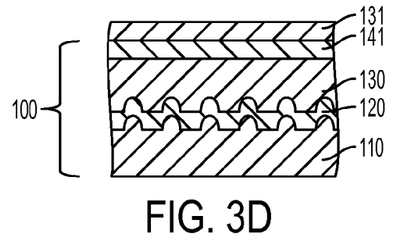
FIG. 3D shows the compound semiconductor substrate of FIG. 3B, where substrate 110 has a plurality of convex portions formed on an upper surface thereof.
Figure 4:
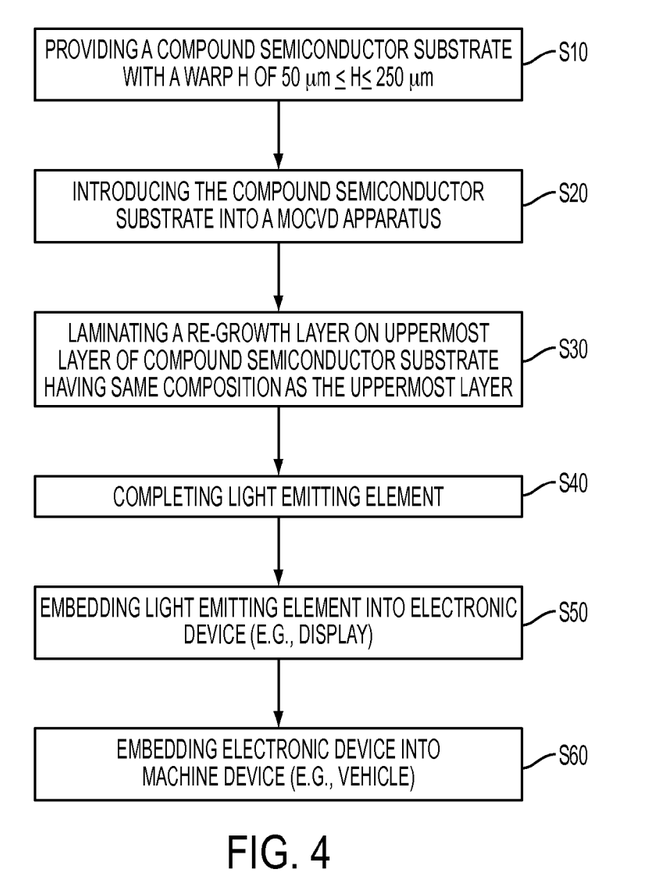
FIG. 4 illustrates a process flow diagram in accordance with the method of the present invention, which begins with providing a compound semiconductor substrate as a raw material substrate, and following completion of the light emitting element, embedding the same into an electronic device or machine device. Particularly.

The n-type contact layer 141 is a layer to provide an n-type electrode 17, and as shown in FIG. 2, an exposed surface 143 is formed in the n-type contact layer 141 so as to provide the n-type electrode 190.

It is preferable that the film thickness of the n-type contact layer 141 be within a range of 0.5 to 5 μm, and more preferably within a range of 2 to 4 μm. In a case where the film thickness of the n-type contact layer 141 is within the above-described range, the crystallinity of a semiconductor is satisfactory maintained.

It is preferable that the n-type contact layer 141 be formed from an $Al_xGa_{1-x}N$ layer ($0 \le x < 1$, preferably $0 \le x \le 0.5$, and more preferably $0 \le x \le 0.1$), and the n-type contact layer 141 be doped with an n-type impurity (an impurity). In a case where the n-type impurity is contained in the n-type contact layer 141 in a concentration of $1\times10^{17}$ to $1\times10^{20}/\text{cm}^3$, and preferably in a concentration of $1\times10^{18}$ to $1\times10^{19}/\text{cm}^3$, a satisfactory ohmic contact with the n-type electrode 190 is maintained and thus this concentration is preferable. The n-type impurity that is used for the n-type contact layer 141 is not particularly limited. However, for example, Si, Ge, Sn, and the like may be exemplified, and Si and Ge are preferable, and Si is more preferable. In addition, in this embodiment, as the n-type impurity (impurity), approximately $5\times10^{18}/\text{cm}^3$ of Si is contained.

(n-Type Clad Layer 142)

The n-type clad layer 142 is provided between the n-type contact layer 141 and the light emitting layer 150. The n-type clad layer 142 is a layer that performs implantation of a carrier to the light emitting layer 150 and containment of the carrier therein, and functions as a buffer layer of the light emitting layer 150. The buffer layer mitigates misalignment of a crystal lattice between the n-type contact layer 141 and the light emitting layer 150. The n-type clad layer 142 may be formed by AlGn, GaN, GaInN, or the like. In addition, in this specification, the composition ratio of each element may be omitted, and the elements may be described as AlGaN and GaInN. In a case where the n-type clad layer 12b is formed from GaInN, it is preferable that a bandgap be made to be larger than that of GaInN of the light emitting layer 150.

The n-type clad layer 142 may have a structure of either a single layer structure or a super lattice structure.

In a case where the n-type clad layer 142 is formed as a single layer, it is preferable that the film thickness of the n-type clad layer 142 be 5 to 500 nm, and more preferably 5 to 100 nm.

In this embodiment, the n-type clad layer 142 may be a single layer, but it is preferable that the n-type clad layer 142 have a super lattice structure in which two thin layers having compositions different from each other are repetitively grown to have a 10-pair number (20 layers) to a 40-pair number (80 layers). In a case where the n-type clad layer 142 has the super lattice structure, when the lamination number of the thin layers is 20 layers or more, the misalignment of the crystal lattice between the n-type contact layer 141 and the light emitting layer 150 may be further effectively mitigated, and thus an effect of improving an output of the semiconductor light emitting element I becomes relatively significant. However, when the lamination number of the thin layers exceeds 80 layers, the super lattice structure may be in disorder, and thus there is a concern that an adverse effect to the light emitting layer 150 may occur. Furthermore, the treatment time taken to form the n-type clad layer 142 becomes long, and thus the productivity may deteriorate.

In addition, in a case where the n-type clad layer 142 has the super lattice structure, a configuration in which an n-side first layer formed from a Group III nitride semiconductor and an n-side second layer formed from a Group III nitride semiconductor having a composition different from that of the n-side first layer are laminated is preferable, and a configuration in which a plurality of the n-side first layers and a plurality of the n-side second layers are alternately laminated in a repetitive manner is more preferable.

In this case, the n-side first layer and the n-side second layer making up the super lattice structure of the n-type clad layer 142 may be set to an alternating structure of GaInN/GaN, an alternating structure of AlGaN/GaN, an alternating structure of GaInN/AlGaN, an alternating structure of GaInN/GaInN in which a composition is different in each case (the description of "a composition is different" in the invention represents that each elemental composition ratio is different), or an alternating structure of AlGaN/AlGaN in which a composition is different in each case, and either the alternating structure of GaInN/GaN or the alternating structure of GaInN/GaInN in which a composition is different in each case is preferable.

In addition, it is preferable that the film thickness of each of the n-side first layer and the n-side second layer be 100 angstroms or less, more preferably 60 angstroms or less, and still more preferably 40 angstroms or less. Further still more preferably, the film thickness of each of the layers is within a range of 10 to 40 angstroms. When the film thickness of the n-side first layer and/or the n-side second layer, which form the super lattice layer, exceeds 100 angstroms, a crystal defect easily occurs, and thus this is not preferable.

(Light Emitting Layer 150)

The light emitting layer 150 is formed in such a manner that the barrier layer 151 formed from a gallium nitride compound semiconductor and the well layer 152 formed from a gallium nitride compound semiconductor containing indium are alternately laminated in a repetitive manner, and are laminated in a sequence in which the barrier layer 151 is disposed on the n-type semiconductor layer 140 side and the p-type semiconductor layer 160 side. In this embodiment, the light emitting layer 150 has a configuration in which six barrier layers 151 and five well layers 152 are alternately laminated in a repetitive manner, the barrier layer 151 is disposed in the uppermost layer and in the lowest layer of the light emitting layer 150, and the well layer 152 is disposed between the respective barrier layers 151.

As the barrier layer 151, for example, gallium nitride-based compound semiconductors such as $Al_cGa_{1-c}N$ ($0 \le c \le 0.3$) having bandgap energy larger than that of the well layer 152 formed from a gallium nitride-based compound semiconductor containing indium may be appropriately used. Among these, GaN is suitable. It is preferable that the film thickness of the barrier layer 13a be equal to or more than 20 angstroms and less than 100 angstroms. When the film thickness of the barrier layer 13a is too small, planarization of an upper surface the barrier layer 151 is deteriorated, and thus a decrease in light emitting efficiency or a decrease in aging characteristics occurs. In addition, when the film thickness of the barrier layer 151 is too large, an increase in a driving voltage or a decrease in light emission occurs. Therefore, the film thickness of the barrier layer 13a is more preferably 70 angstroms or less.

In addition, for example, as a gallium nitride-based compound semiconductor containing indium, gallium-indium nitride such as $Ga_{1-s}In_sN$ ($0<s<0.4$) may be used for the well layer 152.

The film thickness of the well layer 152 is not particularly limited. However, it is preferable that the film thickness be a film thickness in which a quantum effect is obtained, that is, within a threshold film thickness region. For example, it is preferable that the film thickness of the well layer 152 be within a range of 15 to 50 angstroms.

(p-Type Semiconductor Layer 160)

The p-type semiconductor layer 160 includes the p-type clad layer 161 and the p-type contact layer 162. In addition, the p-type contact layer 162 may also function as the p-type clad layer 161.

(p-Type Clad Layer 161)

The p-type clad layer 161 in this embodiment is formed on the light emitting layer 150. The p-type clad layer 161 is a layer that performs implantation of a carrier to the light emitting layer 150 and containment of the carrier therein. The p-type clad layer 161 is not particularly limited as long as the p-type clad layer 161 has a composition in which bandgap energy is larger than that of the light emitting layer 150 and the containment of the carrier in the light emitting layer 150 is possible, but it is preferable that the p-type clad layer 161 be formed from $Al_xGa_{1-x}N$ ($0 \leq x \leq 0.4$). In a case where the p-type clad layer 161 is formed from this AlGaN, this is preferable from a viewpoint of the containment of the carrier in the light emitting layer 150.

The film thickness of the p-type clad layer 161 is not particularly limited, but it is preferable that the film thickness be 1 to 400 nm, and more preferably 5 to 100 nm. It is preferable that a p-type doping concentration of the p-type clad layer 161 be $1 \times 10^{18}$ to $1 \times 10^{21}$/cm$^3$, and more preferably $1 \times 10^{19}$ to $1 \times 10^{20}$/cm$^3$. When the p-type doping concentration is within the above-described range, a satisfactory p-type crystal may be obtained without deteriorating crystallinity. In addition, the p-type clad layer 161 may have a super lattice structure in which a thin film is laminated a plurality of times.

In a case where the p-type clad layer 161 includes the super lattice structure, a p-side first layer formed from a Group III nitride semiconductor and a p-side second layer formed from a Group III nitride semiconductor having a composition different from that of the p-side first layer may be laminated. In the case where the p-type clad layer 161 includes the super lattice structure, the p-type clad layer 161 may have a structure in which the p-side first layer and the p-side second layer are alternately laminated in a repetitive manner.

The p-side first layer and the p-side second layer, which make up the super lattice structure of the p-type clad layer 161, may have compositions that are different from each other, for example, any one composition among AlGaN, GaInN, and GaN. The p-side first layer and the p-side second layer may have an alternating structure of GaInN/GaN, an alternating structure of AlGaN/GaN or an alternating structure of GaInN/AlGaN. In the invention, it is preferable that the p-side first layer and the p-side second layer have either the alternating structure of AlGaN/AlGaN or the alternating structure of AlGaN/GaN.

It is preferable that the film thickness of each of the p-side first layer and the p-side second layer be 100 angstroms or less, be more preferably 60 angstroms or less, be still more preferably 40 angstroms or less, and even more preferably be within a range of 10 to 40 angstroms. When the film thickness of each of the p-side first layer and the p-side second layer, which form the super lattice layer, exceeds 100 angstroms, a crystal defect easily occurs, and thus this is not preferable.

The p-side first layer and the p-side second layer may have a doped structure, respectively, or may have a combination of a doped structure and a non-doped structure. As a doping impurity, an impurity that is known in the related art may be applied without any limitation with respect to the above-described material composition. For example, in a case of using the supper lattice structure having either the alternating structure of AlGaN/GaN or the alternating structure of AlGaN/AlGaN in which a composition is different in each case as the p clad layer, Mg is suitable as the impurity. In addition, the p-side first layer and the p-side second layer, which make up the super lattice structure, may have a structure in which the doped structure and the non-doped structure are combined like a composition represented by GaInN, AlGaN, and GaN.

(p-Type Contact Layer 162)

The p-type contact layer 162 is a layer to provide a positive electrode (p-type electrode) 180. It is preferable that the p-type contact layer 162 be formed from $Al_xGa_{1-x}N$ ($0 \leq x \leq 0.4$) from viewpoints of maintaining satisfactory crystallinity and satisfactory ohmic contact with a p-ohmic electrode. In addition, in a case where the p-type contact layer 162 contains a p-type impurity (impurity) in a concentration of $1 \times 10^{18}$ to $1 \times 10^{21}$/cm$^3$, preferably $5 \times 10^{19}$ to $5 \times 10^{20}$/cm$^3$, this is preferable from viewpoints of maintaining of satisfactory ohmic contact, prevention of occurrence of cracking, and maintaining satisfactory crystallinity. The p-type impurity is not particularly limited, but for example, Mg is preferably used as the p-type impurity.

In addition, the p-type contact layer 162 is formed by laminating a p-type contact lower layer and a p-type contact upper layer, and it is preferable that Mg be contained in the p-type contact lower layer in a concentration of approximately $1 \times 10^{19}$ to $1 \times 10^{20}$/cm$^3$, and Mg be contained in the p-type contact upper layer in a concentration of approximately $2 \times 10^{20}$ to $5 \times 10^{20}$/cm$^3$. According to this configuration, a portion (p-type contact upper layer) that comes into contact with a light-transmitting electrode 15 contains Mg in a high concentration, and a surface thereof becomes flat. Therefore, the light emission output of the semiconductor light emitting element I may be further improved.

In addition, although not particularly limited, it is preferable that the film thickness of the p-type contact layer 162 be 10 to 500 nm, and more preferably 50 to 200 nm. When the film thickness of the p-type contact layer 162 is within this range, this is preferable from a viewpoint of a light emission output.

(Transparent Positive Electrode 170)

The transparent positive electrode 170 is laminated on the p-type semiconductor layer 160, and it is preferable that a contact resistance with the p-type semiconductor layer 160 be small. In addition, it is preferable that the transparent positive electrode 170 be excellent in a light transmitting property so as to effectively take out light from the light emitting layer 150 to the outside of the semiconductor light emitting element I. In addition, it is preferable that the transparent positive electrode 170 have excellent conductivity so as to uniformly diffuse a current across the entire surface of the p-type semiconductor layer 160.

A constituent material of the transparent positive electrode 170 may be, for example, materials that are known in the related art such as ITO ($In_2O_3$—$SnO_2$), AZO ($ZnO$—$Al_2O_3$), IZO ($In_2O_3$—$ZnO$), and GZO ($ZnO$—$Ga_2O_3$). In addition, a structure of the transparent positive electrode 170 is not particularly limited, and a structure that is known in the related art may be adopted. The transparent positive electrode 170 may be formed to cover approximately the entire front surface of the p-type semiconductor layer 160, or may be formed in either a lattice shape or a tree shape.

(Positive Electrode Bonding Pad 180)

Various compositions and structures of the positive electrode bonding pad 180 as an electrode that is formed on the transparent positive electrode 170 are known, and these known compositions and structures may be used without any limitation. The positive electrode bonding pad 180 may be provided by a common means that is well known in this technical field. For example, the positive electrode bonding pad 180 may be formed from a material known in the related art, such as, for example, Au, Al, Ni, and Cu. The structure of the positive electrode bonding pad 180 is not particularly limited, and structures that are known in the related art may be adopted.

It is preferable that the thickness of the positive electrode bonding pad 180 be within a range of 100 to 1,000 nm.

(Negative Electrode Bonding Pad 190)

As shown in FIG. 2, the negative electrode bonding pad 190 is formed to come into contact with the n-type contact layer 141 of the n-type semiconductor layer 140 in the compound semiconductor layer 200 (the n-type semiconductor layer 140, the light emitting layer 150, and the p-type semiconductor layer 160) that is further formed on the intermediate layer 120 and the underlying layer 130 that are formed on the substrate 110. Accordingly, when forming the negative electrode bonding pad 190, a part of the p-type semiconductor layer 160, the light emitting layer 150, and the n-type semiconductor layer 140 is removed to form an exposed region 143 of the n-type contact layer 141, and the negative electrode bonding pad 190 is formed on the exposed region 143.

In regard to a material of the negative electrode bonding pad 190, negative electrodes of various compositions and structures are known, and these known negative electrodes may be used without any limitation, and the negative electrode bonding pad 190 may be provided by a common means that is well known in this technical field.

(Protective Film Layer)

A protective film layer (not shown) is formed to cover an upper surface and a side surface of the transparent positive electrode 170, the exposed surface 143 of the n-type semiconductor layer 140, a side surface of the light emitting layer 150 and the p-type semiconductor layer 160, a side surface or a peripheral portion of the negative electrode bonding pad 190 (n-type electrode) and the positive electrode bonding pad 180 according to necessity. When the protective film layer is formed, water or the like may be prevented from intruding to the inside of the semiconductor light emitting element I, and thus deterioration of the semiconductor light emitting element I may be suppressed.

As the protective film layer, it is preferable to use a material that has an insulation property and transmittance of 80% or more in a wavelength within a range of 300 to 550 nm. Examples of the material include silicon oxide ($SiO_2$), aluminum oxide ($Al_2O_3$), niobium oxide ($Nb_2O_5$), tantalum oxide ($Ta_2O_5$), silicon nitride ($Si_3N_4$), aluminum nitride (AlN), and the like. Among these, $SiO_2$ and $Al_2O_3$ are preferable from the viewpoint that a dense film may be easily formed by CVD film forming.

Hereinafter, a method of manufacturing the semiconductor light emitting element I will be described in detail with reference to the attached drawings.

In addition, the drawings that are referenced in the following description are illustrative only, and the size, the thickness, the dimensions, or the like of each part shown in the drawings are different from the actual dimensional relationship of the semiconductor light emitting element I.

(Method of manufacturing Semiconductor Light Emitting Element)

Next, a method of manufacturing a semiconductor light emitting element will be described.

The method of manufacturing the semiconductor light emitting element I in this embodiment is a method of manufacturing a semiconductor light emitting element including a Group III nitride compound semiconductor layer, and provides a method of manufacturing a semiconductor element. The method includes: a process of preparing a compound semiconductor substrate which is obtained by forming at least one compound semiconductor layer on a substrate and in which a warping amount H is within a range of 50 µm≤H≤250 µm; and a process of sequentially laminating a re-growth layer of the compound semiconductor layer, an n-type semiconductor layer having a composition different from that of the compound semiconductor layer, a light emitting layer, and a p-type semiconductor layer on the compound semiconductor layer of the compound semiconductor substrate.

As a raw material substrate that is used herein, compound semiconductor substrates (collectively referred to as a compound semiconductor substrate) that are obtained by forming at least one compound semiconductor layer on the substrate 110 (for example, a sapphire substrate) may be used, and there is no limitation thereto.

For example, FIG. 2 shows a diagram illustrating an example of the semiconductor light emitting element that is obtained by the manufacturing method to which this embodiment is applied.

As the compound semiconductor substrate which is used in this embodiment and in which at least one compound semiconductor layer (for example, a Group III nitride compound semiconductor) is formed, a compound semiconductor substrate, in which the intermediate layer 120 (buffer layer 120) of a Group III nitride is formed by activating a gas containing a Group V element and a metallic material using plasma so as to allow the gas and metallic material to react with each other on the substrate 110 having a predetermined diameter D and a thickness d, may be used.

In addition, in this embodiment, a compound semiconductor substrate, in which the underlying layer 130 formed from a Group III nitride compound semiconductor is further formed on the intermediate layer 120, may be used.

In addition, in this embodiment, a compound semiconductor substrate, in which the n-type semiconductor layer 140, for example, the n-type contact layer 141 (first n-type semiconductor layer 141), is further formed on the underlying layer 130, may be used.

(Process of Laminating Re-Growth Layer 131)

For example, FIG. 2 shows a structure in which the re-growth layer of the compound semiconductor layer, the n-type semiconductor layer, the light emitting layer, and the p-type semiconductor layer are sequentially laminated on a compound semiconductor substrate that is prepared by forming the intermediate layer 120 and the underlying layer 130 on the substrate 110 as a compound semiconductor substrate in which one compound semiconductor layer is formed.

Here, the re-growth layer of the compound semiconductor layer represents a re-growth layer formed from a compound semiconductor layer on one surface (the uppermost layer) of the raw material substrate.

In addition, in this embodiment, before laminating the re-growth layer, it is preferable to perform a heat treatment (thermal cleaning) in a metal organic chemical vapor deposition apparatus under an atmosphere containing nitrogen and ammonia and under conditions of a pressure of 15 to 100 kPa and a substrate temperature of 500 to 1,000° C.

The heat treatment atmosphere may be, for example, an atmosphere containing only nitrogen instead of the atmosphere containing nitrogen and ammonia. In addition, under an atmosphere containing only hydrogen, the re-growth layer 131 decomposes and the crystallinity deteriorates and thus this atmosphere is not preferable. In addition, it is preferable that the pressure inside a growth chamber of the MOCVD apparatus be set to 15 to 100 kPa.

When the heat treatment is performed under these conditions, even when a surface of the substrate 100 in which the respective layers including the underlying layer 130 are formed is contaminated, a contamination material may be removed before forming the re-growth layer 131. Accordingly, the crystallinity of the re-growth layer 131 may be improved. As a result, the crystallinity of the n-type contact layer 141 formed on the re-growth layer 131 becomes more satisfactory.

In addition, in a case where the contaminated surface of the underlying layer 130 is left as is without performing the heat treatment under these conditions, the crystallinity of the n-type contact layer 141 that is formed on the re-growth layer 131 deteriorates. As a result, a reverse current (IR) does not decrease, and electrostatic discharge (ESD) breakdown voltage becomes deficient, and thus the reliability of the semiconductor light emitting element I deteriorates.

The substrate temperature during the lamination of the re-growth layer is preferably set to be within a range of 700 to 1,200° C., and more preferably within a range of 900 to 1,200° C.

When the substrate temperature is less than 700° C., the crystallinity of the re-growth layer deteriorates. On the other hand, when the substrate temperature exceeds 1,200° C., surface roughness is caused, and thus there is a concern that the crystallinity of the n-type semiconductor layer, the light emitting layer, and the p-type semiconductor layer that are subsequently laminated may deteriorate, and thus this temperature range is not preferable.

In addition, a growth pressure during the lamination of the re-growth layer may be set to be within a range of 15 to 100 kPa. When the growth pressure is less than 15 kPa, the crystallinity of the re-growth layer deteriorates. On the other hand, when the growth pressure exceeds 100 kPa, there is a restriction on an apparatus aspect, and thus this pressure range is not preferable. In addition, the growth pressure exceeds 100 kPa, the growth rate of the re-growth layer does not increase, and thus productivity deteriorates.

In addition, it is preferable to use a substrate 110 which has a main surface including a flat surface formed from a (0001) C-plane and a plurality of convex portions formed from a surface not parallel with the C-plane in one surface (front surface) on which the intermediate layer 120 formed from a Group III nitride is formed, and which is processed in such a manner that the convex portions have a base portion width $d_1$ of 0.05 to 1.5 μm and a height h of 0.05 to 1 μm.

The transparent positive electrode 170, the positive electrode bonding pad 180, the negative electrode bonding pad 190, and the like are formed in the semiconductor light emitting element in which the re-growth layer of the compound semiconductor layer, the n-type semiconductor layer having a composition different from that of the compound semiconductor layer, the light emitting layer, and the p-type semiconductor layer are sequentially laminated. The substrate 110 is ground until a predetermined thickness is obtained, and then is cut to have an appropriate size so as to manufacture a semiconductor light emitting element chip.

Commonly, the diameter D of the substrate 110 that is used in the invention is selected from a range of 50 mm (approximately 2 inches) to 150 mm (approximately 6 inches). Particularly, in the invention, the diameter D of the substrate 110 is preferably selected from a range of 50 mm (approximately 2 inches) to 200 mm (approximately 8 inches). In addition, commonly, the thickness d of the substrate 110 is selected from a range of 0.4 to 2.0 mm, preferably 0.4 to 1.5 mm, and more preferably 0.6 to 1.3 mm.

As the raw material substrate (compound semiconductor substrate 100) that is used in the invention, a substrate in which a warping amount H is within a range of 50 μm≤H≤250 μm is prepared. In addition, in the invention, it is preferable that the warping amount H of the compound semiconductor substrate 100 be within a range of 80 μm≤H≤200 μm, more preferably 80 μm≤H≤150 μm, and still more preferably 80 μm≤H≤120 μm.

Here, when the compound semiconductor substrate 100 is disposed on a horizontal reference surface with the compound semiconductor layer located on an upper side, the warping (warping amount H) of the compound semiconductor substrate 100 is defined as a difference between the maximum value and the minimum value of a distance between the reference surface and a wafer surface. In the invention, measurement of the warping amount H of the compound semiconductor substrate 100 was performed by measuring a SORI value using a laser light oblique incidence interferometer (Flatness tester FT-17, manufactured by NIDEK CO., LTD). In addition, in a case where a warping direction has a convex shape, a positive value is given, and in a case where the warping direction has a concave shape, a negative value is given.

In the raw material substrate (compound semiconductor substrate 100) that is used in the invention, the warping amount H of the substrate 110 is arbitrarily selected from a range of −30 μm≤H≤30 μm, −30 μm≤H<0, or 0<H≤30 μm. In addition, the warping H of the substrate 110 is defined by the same method as the description of the warping amount with respect to the compound semiconductor substrate 100.

In addition, at least one compound semiconductor layer is formed on the substrate 110 by processing the substrate 110 in such a manner the substrate 110 has a main surface, which includes a flat surface formed from a (0001) C-plane and a plurality of convex portions formed from a surface not parallel with the C-plane, in one surface (front surface) thereof, and the convex portions have a base portion width $d_1$ of 0.05 to 1.5 μm and a height h of 0.05 to 1 μm. In the example shown in FIG. 2, a compound semiconductor substrate in which the intermediate layer 120 and the underlying layer 130 are formed on the substrate 110 is used as a raw material substrate.

It is preferable that the warping amount H of the substrate 110 that is used as the raw material substrate (compound semiconductor substrate 100) in the invention be selected from a range of −10 μm≤H≤10 μm, −10 μm≤H<0, or 0<H≤10 μm.

The warping amount H of the compound semiconductor substrate 100 that is used in the invention is affected by the thickness, crystallinity, and composition of the at least one compound semiconductor layer that is formed on the substrate 110 in addition to a warping amount of the substrate 110 itself. Therefore, in the invention, as the compound semiconductor substrate 100 that is used as a raw material substrate, a substrate in which the warping amount H is within a range of 50 μm≤H≤250 μm is used.

In the invention, when the warping amount H of the compound semiconductor substrate 100 is within the above-described range, for example, a light emission wavelength distribution σ of the compound semiconductor layer 200, which is obtained by sequentially forming the re-growth layer of the compound semiconductor layer, the n-type semiconductor layer having a composition different that of the compound semiconductor layer, the light emitting layer, and the p-type semiconductor layer on the compound semiconductor layer of the compound semiconductor substrate by the MOCVD method, may be set to 3.5 nm or less.

In addition, in the invention, the light emission wavelength distribution σ of the compound semiconductor layer 200 may be set to 3.5 nm or less by controlling growth conditions such as a temperature of the substrate on which the re-growth layer of the compound semiconductor layer is laminated, and a growth pressure.

When the warping amount H of the compound semiconductor substrate 100 is less than 50 μm, there is a tendency that the light emission wavelength distribution σ from the compound semiconductor layer 200 after laminating the re-growth layer becomes larger than 3.5 nm.

In addition, when the warping amount H of the compound semiconductor substrate 100 is larger than 250 μm, it is difficult to form the re-growth layer in a uniform thickness over the entirety of the substrate. In addition, there is a tendency that the light emission wavelength distribution σ from the compound semiconductor layer 200 after laminating the re-growth layer becomes larger than 3.5 nm.

In the MOCVD method, hydrogen ($H_2$) or nitrogen ($N_2$) is used as a carrier gas, trimethyl gallium (TMG) or triethyl gallium (TEG) is used as a Ga source that is a Group III raw material, trimethyl aluminum (TMA) or triethyl aluminum (TEA) is used as an Al source, trimethyl indium (TMI) or triethyl indium (TEI) is used as an In source, and ammonia ($NH_3$) or hydrazine ($N_2H_4$) is used as an N source that is a Group V raw material.

In regard to a dopant, in an n-type, monosilane ($SiH_4$) or disilane ($Si_2H_6$) may be used as an Si raw material, while an organic germanium compound such as a germanium gas ($GeH_4$), tetramethyl germanium (($CH_3$)$_4$Ge), and tetraethyl germanium (($C_2H_5$)$_4$Ge) may be used as a Ge raw material.

In addition, the germanium nitride-based compound semiconductor may have a configuration containing a different Group III element in addition to Al, Ga, and In, and may contain a dopant element such as Ge, Si, Mg, Ca, Zn, and Be according to necessity. Furthermore, without being limited to an intentionally added element, the germanium nitride-based compound semiconductor may contain an impurity that is inevitably contained in accordance with film forming conditions and a minute amount of impurity that is contained in a raw material and a reaction tube material.

In addition, after forming the underlying layer 130 of the compound semiconductor layer 200 according to an MOCVD method, each layer of the n-type contact layer 141 and the n-type clad layer 142 may be formed by a sputtering method, the light emitting layer 150 may be subsequently formed thereon by the MOCVD method, and each layer of the p-type clad layer 161 and the p-type contact layer 162 that make up the p-type semiconductor layer 160 may be formed by a reactive sputtering method.

In this embodiment, the re-growth layer 131 formed from the compound semiconductor layer is formed on the compound semiconductor substrate 100 by the above-described method, the compound semiconductor layer 200 including the light emitting layer 150 is formed, and the transparent positive electrode 170 is laminated on the p-type semiconductor layer 160 of the compound semiconductor layer 200, and the positive electrode bonding pad 180 is formed thereon. Furthermore, a wafer, in which the negative electrode bonding pad 190 is provided in the exposed region 143 formed in the n-type contact layer 141 of the n-type semiconductor layer 140, is formed.

Then, a surface to be ground of the substrate 110 is ground and polished until a predetermined thickness is obtained. In this embodiment, the substrate 110 of the wafer is ground by a grinding process of approximately 20 minutes, and thus the thickness of the substrate 110 is reduced to approximately 120 μm from approximately 900 μm. Furthermore, in this embodiment, a polishing process is performed subsequently to the grinding process, and thus a predetermined thickness of the substrate 110 is obtained.

Subsequently, the wafer in which the thickness of the substrate 110 is adjusted is cut into, for example, a square of 350 μm square to form a semiconductor light emitting element in which the intermediate layer 120, the underlying layer 130, and the compound semiconductor layer 200 are formed on the substrate 110.

[Lamp]

In a lamp of the invention, a semiconductor light emitting element that is obtained by the method of manufacturing the semiconductor light emitting element of the invention is used.

As the lamp of the invention, a lamp that is obtained by combining the semiconductor light emitting element of the invention and a fluorescent substance may be exemplified. The lamp in which the semiconductor light emitting element of the invention and the fluorescent substance are combined may have a configuration that is known to a person having ordinary skill in the art by means that is known to a person having ordinary skill in the art.

In addition, a technology in which light emission color is changed by combining the semiconductor light emitting element and the fluorescent substance is known in the related art, and this technology may be adopted in the lamp of the invention without limitation.

As an example of the lamp of the invention, a cannon ball type is an exemplary example, and the semiconductor light emitting element I is used as a light source (not shown). The semiconductor light emitting element I is mounted by bonding the positive electrode bonding pad of the semiconductor light emitting element I to one of two frames using a wire, and bonding the negative electrode bonding pad of the light emitting element I to the other frame using a wire. In addition, the periphery of the semiconductor light emitting element I is sealed with a mold formed from a transparent resin.

The lamp of the invention uses the semiconductor light emitting element I of the invention, and thus has excellent light emission characteristics. In addition, the lamp of the invention may be used in an arbitrary use such as a cannon ball type for a general use, a side view type for a backlight use of a cellular phone, and a top view type that is used in a display.

In addition, a lamp that is manufactured using the semiconductor light emitting element of the invention may be embedded in various machine devices or apparatuses. For example, the lamp may be used in electronic devices such as a cellular phone, a display, various panels, a computer, a gaming machine, and an illumination device, or machine devices such as a vehicle in which the electronic device is embedded.

EXAMPLES

Hereinafter, the invention will be described in more detail on the basis of examples. However, the invention is not limited to the following examples as long as it does not depart from the gist of the invention.

An evaluation method of the warping amount H of a sapphire substrate this is used in these examples and distribution of a light emission wavelength (light emission wavelength distribution σ) are as follows.

(1) Warping Amount H of Compound Semiconductor Substrate 100

The warping amount H of the compound semiconductor substrate 100 was evaluated in accordance with a SORI value that was measured by a laser light oblique incidence interferometer (Flatness tester FT-17, manufactured by NIDEK CO., LTD). The SORI value was measured in such a manner that the compound semiconductor substrate was suctioned by a bow chuck of the flatness tester and the substrate was inclined at an angle of 8° in a front direction from a vertical direction. The measurement was performed in a range excluding 1 mm from the periphery of the sapphire substrate (an inside value was 1 mm).

(2) Distribution of Light Emission Wavelength (Light Emission Wavelength Distribution σ) Obtained from Compound Semiconductor Wafer Although not limited in the invention, the measurement of the light emission wavelength distribution a may be preferably measured using a PL mapper (RPM-Σ, manufactured by ACCENT INC.).

Example 1

The semiconductor light emitting element I shown in FIG. 1 was manufactured by the following method.

A raw material substrate 100 (compound semiconductor substrate 100) having a warping amount H of 110 μm and a 4-inch diameter size was prepared, and this substrate was conveyed to the inside of the metal organic chemical vapor deposition apparatus (an MOCVD furnace) to form the regrowth layer 131, which had the same composition as the GaN underlying layer 130 that was an upper semiconductor layer of the raw material substrate 100, on the surface of the raw material substrate 100 under conditions in which the growth temperature was 1,100° C., the growth pressure was 40 kPa, and the film thickness was 0.6 μm. The forming of the re-growth layer 131 was performed in accordance with the MOCVD method in the related art. However, at this time, before forming the re-growth layer 131, the raw material substrate 100 was subjected to a heat treatment (thermal cleaning) under an atmosphere containing nitrogen and ammonia and under conditions of a pressure of 95 kPa and a substrate temperature of 950° C.

In addition, the substrate 110 that was used as the raw material substrate 100 was a substrate which was formed from sapphire and in which the plate thickness was 900 μm. In one surface on which the semiconductor layer was formed, convex shapes having a base portion width of 1.0 μm and a height of 1.0 μm were formed in a (0001) C-plane of the sapphire substrate with a distance between convex portions set to 1.8 μm. A processed substrate having the plurality of convex shapes was manufactured in accordance with a method described in WO/2009/154215.

In addition, on the surface of the substrate that was processed to have the plurality of convex shapes, the buffer layer 120 (intermediate layer 120) formed from AlN was formed to have the film thickness of 50 nm in a sputtering film formation apparatus. Furthermore, the underlying layer 130 that was formed from GaN and had a film thickness of 9 μm was formed on a surface of the buffer layer 120 in the MOCVD furnace.

Subsequently, the n-type contact layer 141, the n-type clad layer 142, the light emitting layer 150, the p-type clad layer 161, and the p-type contact layer 162 that had a predetermined film thickness were sequentially formed on the re-growth layer 131 having the same composition as the GaN underlying layer by the MOCVD method in the related art.

Subsequently, the transparent positive electrode 170 formed from ITO, the positive electrode bonding pad 180, the negative electrode bonding pad 190, and the protective film layer were provided on the p-type semiconductor layer 160 by common means (refer to WO/2009/154215) that is well known in this technical field. In addition, the positive electrode bonding pad 180 was configured to have a three-layer structure, on the transparent positive electrode 170 side, including a metallic reflective layer of 200 nm that was formed from Al, a barrier layer of 80 nm that was formed from Ti, and a bonding layer of 1,100 nm that was formed from Au.

The negative electrode bonding pad 190 was formed in a desired region to have a two-layer structure of Ti/Au from the exposed surface 143 side of the n-type contact layer 141.

In this manner, a light emitting element substrate wafer, in which a plurality of the semiconductor light emitting elements I of Example 1 were formed on the substrate, was obtained. Furthermore, a rear surface of the light emitting substrate wafer was ground and polished into a mirror-shaped surface by common means (refer to WO/2009/154215) that is well known in this technical field, and this substrate wafer was cut into a square chip of 350 μm square to obtain an LED chip.

In addition, the main manufacturing conditions related to the invention that was carried out in Example 1 are collectively shown in Table 1. Blue-light wavelength distribution σ (wavelength distribution standard deviation) of a semiconductor light emitting element I that was manufactured herein was 2.2 nm, and an accepted-product acquisition rate for each light emitting element substrate wafer was high.

Example 2

An LED chip was manufactured under the same manufacturing conditions as Example 1 except that the raw material substrate 100 of Example 1 was changed to a raw material substrate 100 having the warping amount H of 120 μm, the growth temperature of the re-growth layer 131 was changed to 1,200° C., and the growth pressure was changed to 20 kPa. The main manufacturing conditions are collectively shown in Table 1. The blue-light wavelength distribution σ (wavelength distribution standard deviation) of a semiconductor light emitting element I that was manufactured herein was 1.9 nm, and an accepted-product acquisition rate for each light emitting element substrate wafer was high.

Example 3

An LED chip was manufactured under the same manufacturing conditions as Example 1 except that the raw material substrate 100 of Example 1 was changed to a raw material substrate 100 having the warping amount H of 100 μm, the growth temperature of the re-growth layer 131 was changed to 1,000° C., and the growth pressure was changed to 60 kPa. The main manufacturing conditions are collectively shown in Table 1. The blue-light wavelength distribution σ (wavelength distribution standard deviation) of a semiconductor light emitting element I that was manufactured herein was 2.7 nm, and an accepted-product acquisition rate for each light emitting element substrate wafer was high.

Example 4

An LED chip was manufactured under the same manufacturing conditions as Example 1 except that the raw material substrate 100 of Example 1 was changed to a raw material substrate 100 having the warping amount H of 95 μm, the growth temperature of the re-growth layer 131 was changed to 900° C., and the growth pressure was changed to 80 kPa. The main manufacturing conditions are collectively shown in Table 1. The blue-light wavelength distribution σ (wavelength distribution standard deviation) of a semiconductor light emitting element I that was manufactured herein was 3.1 nm, and an accepted-product acquisition rate for each light emitting element substrate wafer was high.

Example 5

An LED chip was manufactured under the same manufacturing conditions as Example 1 except that the raw material substrate 100 of Example 1 was changed to a raw material substrate 100 in which the warping amount H was 130 μm, the thickness of the upper semiconductor layer was 8 μm, and the composition of the upper semiconductor layer was set to an n-type contact layer, the re-growth layer 131 was set to have the same composition as the n-type contact layer, the thickness of the re-growth layer 131 was changed to 2 μm, and the growth pressure was changed to 20 kPa. The main manufacturing conditions are collectively shown in Table 1. The blue-light wavelength distribution σ (wavelength distribution standard deviation) of a semiconductor light emitting element I that was manufactured herein was 2.7 nm, and the accepted-product acquisition rate for each light emitting element substrate wafer was high.

Example 6

An LED chip was manufactured under the same manufacturing conditions as Example 5 except that the warping amount H was changed to 120 μm and the thickness of the upper semiconductor layer was changed to 9 μm in the raw material substrate 100 of Example 5, the thickness of the re-growth layer 131 was changed to 1 and the growth pressure was changed to 40 kPa. The main manufacturing conditions are collectively shown in Table 1.

The blue-light wavelength distribution σ (wavelength distribution standard deviation) of a semiconductor light emitting element I that was manufactured herein was 2.0 nm, and an accepted-product acquisition rate for each light emitting element substrate wafer was high.

Example 7

An LED chip was manufactured under the same manufacturing conditions as Example 5 except that the warping amount H was changed to 100 μm and the thickness of the upper semiconductor layer was changed to 10 μm in the raw material substrate 100 of Example 5, the thickness of the re-growth layer 131 was changed to 0.4 and the growth pressure was changed to 80 kPa. The main manufacturing conditions are collectively shown in Table 1. The blue-light wavelength distribution σ (wavelength distribution standard deviation) of a semiconductor light emitting element I that was manufactured herein was 2.6 nm, and an accepted-product acquisition rate for each light emitting element substrate wafer was high.

Example 8

An LED chip was manufactured under the same manufacturing conditions as Example 5 except that the warping amount H was changed to 90 μm and the thickness of the upper semiconductor layer was changed to 10 μm in the raw material substrate 100 of Example 5, the thickness of the re-growth layer 131 was changed to 0.2 and the growth pressure was changed to 100 kPa. The main manufacturing conditions are collectively shown in Table 1. The blue-light wavelength distribution σ (wavelength distribution standard deviation) of a semiconductor light emitting element I that was manufactured herein was 2.9 nm, and an accepted-product acquisition rate for each light emitting element substrate wafer was high.

Example 9

An LED chip was manufactured under the same manufacturing conditions as Example 5 except that the warping amount H was changed to 50 μm and the thickness of the upper semiconductor layer was changed to 5 μm in the raw material substrate 100 of Example 5, the thickness of the re-growth layer 131 was changed to 0.6 the growth pressure was changed to 80 kPa, and the raw material substrate 100 was not subjected to the heat treatment (thermal cleaning) before forming the re-growth layer 131. The main manufacturing conditions are collectively shown in Table 1. The blue-light wavelength distribution σ (wavelength distribution standard deviation) of a semiconductor light emitting element I that was manufactured herein was 2.3 nm, and an accepted-product acquisition rate for each light emitting element substrate wafer was high.

Example 10

An LED chip was manufactured under the same manufacturing conditions as Example 5 except that the warping amount H was changed to 80 the thickness of the upper semiconductor layer was changed to 5 and the plate thickness of the substrate 110 was changed to 700 μm in the raw material substrate 100 of Example 5, the thickness of the re-growth layer 131 was changed to 0.6 and the growth pressure was changed to 60 kPa. The main manufacturing conditions are collectively shown in Table 1. The blue-light wavelength distribution σ (wavelength distribution standard deviation) of a semiconductor light emitting element I that was manufactured herein was 2.9 nm, and an accepted-product acquisition rate for each light emitting element substrate wafer was high.

Example 11

An LED chip was manufactured under the same manufacturing conditions as Example 1 except that the warping amount H was changed to 130 μm, the thickness of the upper semiconductor layer was changed to 8 μm, the diameter of the substrate 110 was changed to 6 inches, and the plate thickness thereof was changed to 1,300 μm in the raw material substrate 100 of Example 1. The main manufacturing conditions are collectively shown in Table 1. The blue-light wavelength distribution σ (wavelength distribution standard deviation) of a semiconductor light emitting element I that was manufactured herein was 2.1 nm, and an accepted-product acquisition rate for each light emitting element substrate wafer was high.

Comparative Example 1

An LED chip was manufactured under the same manufacturing conditions as Example 5 except that the warping amount H was changed to 140 μm and the thickness of the upper semiconductor layer was changed to 10 μm in the raw material substrate 100 of Example 5, the formation of the re-growth layer 131 was not performed, and the heat treatment (thermal cleaning) was not performed. The main manufacturing conditions are collectively shown in Table 1. The blue-light wavelength distribution σ (wavelength distribution standard deviation) of a semiconductor light emitting element I that was manufactured herein was 4.7 nm, and an accepted-product acquisition rate for each light-emitting element substrate wafer was significantly low.

Comparative Example 2

An LED chip was manufactured under the same manufacturing conditions as Example 1 except that the process of forming a re-growth layer by using the raw material substrate 100 of Example 1 was not performed, and the underlying layer 130 to the p-type semiconductor layer 160 was made to grow in a lump using the substrate 110 having the diameter of 4 inches and the plate thickness of 900 μm in one MOCVD furnace in Comparative Example 2. The main manufacturing conditions are collectively shown in Table 1. The blue-light wavelength distribution σ (wavelength distribution standard deviation) of a semiconductor light emitting element I that was manufactured herein was 4.7 nm, and an accepted-product acquisition rate for each light emitting element substrate wafer was significantly low.

As described above, when comparing the respective manufacturing conditions and the wavelength distribution standard deviations σ of Examples 1 to 11, and Comparative Examples 1 to 2, the following features were found.

That is, in the compound semiconductor substrate in which the GaN underlying layer was set to the upper semiconductor layer or in the compound semiconductor substrate in which the n-type contact layer was set to the upper semiconductor layer, each including at least one compound semiconductor layer that was formed on a substrate and having the warping amount H within a range of 50 μm≤H≤250 μm, when the re-growth layer of the compound semiconductor layer was laminated on the compound semiconductor layer of the compound semiconductor substrate in the metalorganic chemical vapor deposition apparatus, the blue-light wavelength distribution σ (wavelength distribution standard deviation) of the semiconductor light emitting element I was 3.1 nm or less, and the accepted-product acquisition rate for each light emitting element substrate wafer was high.

In addition, as described in Examples 1 to 4, in the case of using the compound semiconductor substrate in which the warping amount H was within a range of 50 μm≤H≤250 μm and the GaN underlying layer was set to the upper semiconductor layer, and separately laminating the re-growth layer of the compound semiconductor layer in the metal organic chemical vapor deposition apparatus, when the substrate temperature during the lamination of the re-growth layer was set to 700 to 1,200° C., the blue-light wavelength distribution σ (wavelength distribution standard deviation) of the semiconductor light emitting element I became 3.1 nm or less, and the accepted-product acquisition rate for each light emitting element substrate wafer was significantly improved.

In addition, when the growth pressure during the lamination of the re-growth layer was set within a range of 15 to 100 kPa, the blue-light wavelength distribution σ (wavelength distribution standard deviation) of the semiconductor light emitting element I became 3.1 nm or less, and an accepted-product acquisition rate for each light-emitting element substrate wafer was significantly improved.

Furthermore, when the substrate temperature during the lamination of the re-growth layer was set within a range of 700 to 1,200° C. and the growth pressure during the lamination of the re-growth layer was controlled within a range of 15 to 100 kPa, the blue-light wavelength distribution σ (wavelength distribution standard deviation) of the semiconductor light emitting element I became 3.1 nm or less, and the accepted-product acquisition rate for each light emitting element substrate wafer was significantly improved.

That is, even when the raw material substrate 100 having the large warping amount H in the warping amount H within a range of 50 μm≤H≤250 μm was used, when the growth pressure was lowered and the substrate temperature was raised to suppress the warping in the re-growth process, it was found that the blue-light wavelength distribution σ (wavelength distribution standard deviation) of the semiconductor light emitting element I became 3.1 nm or less, and the accepted-product acquisition rate for each light emitting element substrate wafer was significantly improved.

TABLE 1

| | Raw material substrate 100 | | | | | Thermal cleaning | | Re-growth layer 131 | | | | Wavelength |
|---|---|---|---|---|---|---|---|---|---|---|---|---|
| | Substrate 110 | | Thickness of upper semiconductor layer (μm) | Warping amount H (μm) | Upper semiconductor layer | Whether or not process is present | Pressure (kPa) | Temperature (° C.) | Semiconductor layer | Thickness (μm) | Growth temperature (° C.) | Growth pressure (kPa) | distribution standard deviation σ (nm) |
| | Diameter (inch) | Plate thickness (μm) | | | | | | | | | | | |
| Example 1 | 4 | 900 | 9 | 110 | GaN underlying layer | Present | 95 | 950 | GaN underlying layer | 0.6 | 1,100 | 40 | 2.2 |
| Example 2 | 4 | 900 | 9 | 120 | GaN underlying layer | Present | 95 | 950 | GaN underlying layer | 0.6 | 1,200 | 20 | 1.9 |
| Example 3 | 4 | 900 | 9 | 100 | GaN underlying layer | Present | 95 | 950 | GaN underlying layer | 0.6 | 1,000 | 60 | 2.7 |
| Example 4 | 4 | 900 | 9 | 95 | GaN underlying layer | Present | 95 | 950 | GaN underlying layer | 0.6 | 900 | 80 | 3.1 |
| Example 5 | 4 | 900 | 8 | 130 | N-type contact layer | Present | 95 | 950 | N-type contact layer | 2 | 1,100 | 20 | 2.7 |
| Example 6 | 4 | 900 | 9 | 120 | N-type contact layer | Present | 95 | 950 | N-type contact layer | 1 | 1,100 | 40 | 2 |
| Example 7 | 4 | 900 | 10 | 100 | N-type contact layer | Present | 95 | 950 | N-type contact layer | 0.4 | 1,100 | 80 | 2.6 |
| Example 8 | 4 | 900 | 10 | 90 | N-type contact layer | Present | 95 | 950 | N-type contact layer | 0.2 | 1,100 | 100 | 2.9 |
| Example 9 | 4 | 900 | 5 | 50 | N-type contact layer | Not present | — | — | N-type contact layer | 0.6 | 1,100 | 80 | 2.3 |

TABLE 1-continued

| | Raw material substrate 100 | | | | | | | | | | |
|---|---|---|---|---|---|---|---|---|---|---|---|
| | Substrate 110 | | Thickness of upper semi-conductor layer (μm) | Warping amount H (μm) | Upper semi-conductor layer | Thermal cleaning | | | Re-growth layer 131 | | | Wave-length distribution standard deviation σ (nm) |
| | Diameter (inch) | Plate thickness (μm) | | | | Whether or not process is present | Pressure (kPa) | Temperature (° C.) | Semi-conductor layer | Thickness (μm) | Growth temperature (° C.) | Growth pressure (kPa) | |
| Example 10 | 4 | 700 | 5 | 80 | N-type contact layer | Present | 95 | 950 | N-type contact layer | 0.6 | 1,100 | 60 | 2.9 |
| Example 11 | 6 | 1,300 | 8 | 130 | GaN underlying layer | Present | 95 | 950 | GaN underlying layer | 0.6 | 1,100 | 40 | 2.1 |
| Comparative Example 1 | 4 | 900 | 10 | 140 | N-type contact layer | Not present | — | — | Re-crystal layer is not present | | | | 4.7 |
| Comparative Example 2 | 4 | 900 | Not present (underlying layer to light emitting layer are made to grow in a lump) | | | Not present | | | Not present (underlying layer to light emitting layer are made to grow in a lump) | | | | 4.7 |

REFERENCE SIGNS LIST

100: Compound semiconductor substrate
110: Substrate
120: Intermediate layer
130: Underlying layer
131: Re-growth layer
140: n-Type semiconductor layer
150: Light emitting layer
160: p-Type semiconductor layer
170: Transparent positive electrode
180: Positive electrode bonding pad
190: Negative electrode bonding pad
200: Compound semiconductor layer (Group III compound semiconductor layer)
I: Semiconductor light emitting element

The invention claimed is:

1. A method of manufacturing a semiconductor light emitting element including an n-type semiconductor layer, a light emitting layer, and a p-type semiconductor layer that are formed from a compound semiconductor, the method comprising:
providing a compound semiconductor substrate as a raw material substrate which has been obtained by forming at least one compound semiconductor layer on a substrate, said compound semiconductor substrate having a warping amount H within a range of 50 μm≤H≤250 μm;
introducing the compound semiconductor substrate into a metal organic chemical vapor deposition apparatus; and
laminating a re-growth layer on an uppermost compound semiconductor layer of the compound semiconductor substrate by a metal organic chemical vapor deposition process, said re-growth layer having the same composition as the uppermost compound semiconductor layer of the compound semiconductor substrate.

2. The method of manufacturing a semiconductor light emitting element according to claim 1,
wherein the compound semiconductor is a Group III nitride compound semiconductor.

3. The method of manufacturing a semiconductor light emitting element according to claim 1,
wherein the re-growth layer is formed to have a film thickness of 0.2 to 5 μm.

4. The method of manufacturing a semiconductor light emitting element according to claim 1,
wherein a temperature of the substrate of the compound semiconductor substrate during the lamination of the re-growth layer is set to 700 to 1,200° C.

5. The method of manufacturing a semiconductor light emitting element according to claim 1,
wherein a growth pressure during the lamination of the re-growth layer is set to 15 to 100 kPa.

6. The method of manufacturing a semiconductor light emitting element according to claim 1, further comprising:
a process of setting a substrate temperature of the compound semiconductor substrate during the lamination of the re-growth layer to a range of 700 to 1,200° C.; and
a process of setting a growth pressure during the lamination of the re-growth layer to a range of 15 to 100 kPa.

7. The method of manufacturing a semiconductor light emitting element according to claim 1,
wherein before laminating the re-growth layer, a heat treatment is performed in the same metal organic chemical vapor deposition apparatus as used in claim 1 under conditions of a pressure of 15 to 100 kPa and a substrate temperature of the compound semiconductor substrate of 500 to 1,000° C. and in an atmosphere containing nitrogen and ammonia.

8. The method of manufacturing a semiconductor light emitting element according to claim 1,
wherein the compound semiconductor substrate is obtained by forming at least a buffer layer and an underlying layer on the substrate.

9. The method of manufacturing a semiconductor light emitting element according to claim 1,
wherein the compound semiconductor substrate is obtained by forming at least a buffer layer, an underlying layer, and a first n-type semiconductor layer on the substrate.

10. The method of manufacturing a semiconductor light emitting element according to claim 1,
wherein the substrate has a main surface, which includes a flat surface formed from a (0001) C-plane and a plurality of convex portions formed from a surface not parallel with the C-plane, in one surface of the substrate, and the plurality of convex portions have a base portion width d1 of 0.05 to 1.5 μm and a height h of 0.05 to 1 μm.

* * * * *